United States Patent
Chattopadhyay et al.

(10) Patent No.: US 8,693,973 B2
(45) Date of Patent: Apr. 8, 2014

(54) 670 GHZ SCHOTTKY DIODE BASED SUBHARMONIC MIXER WITH CPW CIRCUITS AND 70 GHZ IF

(75) Inventors: Goutam Chattopadhyay, Pasadena, CA (US); Erich T. Schlecht, Pasadena, CA (US); Choonsup Lee, La Palma, CA (US); Robert H. Lin, Chino, CA (US); John J. Gill, La Crescenta, CA (US); Seth Sin, Pasadena, CA (US); Imran Mehdi, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 141 days.

(21) Appl. No.: 13/462,679

(22) Filed: May 2, 2012

(65) Prior Publication Data

US 2012/0280742 A1    Nov. 8, 2012

Related U.S. Application Data

(60) Provisional application No. 61/481,633, filed on May 2, 2011.

(51) Int. Cl.
*H04B 1/26* (2006.01)
(52) U.S. Cl.
USPC .................. 455/325; 455/190.1; 455/313

(58) Field of Classification Search
USPC ............. 455/326, 327, 302, 190.1, 207, 313, 455/323, 330, 189.1, 325
See application file for complete search history.

(56) References Cited

U.S. PATENT DOCUMENTS

| | | | | |
|---|---|---|---|---|
| 4,000,469 A | * | 12/1976 | McMaster | 455/327 |
| 4,485,488 A | * | 11/1984 | Houdart | 455/327 |
| 6,725,029 B1 | * | 4/2004 | Allen | 455/302 |
| 6,965,655 B1 | * | 11/2005 | Mostov et al. | 375/345 |
| 7,130,604 B1 | * | 10/2006 | Wong et al. | 455/302 |
| 7,167,698 B2 | * | 1/2007 | Katz | 455/326 |
| 7,386,075 B2 | * | 6/2008 | Mostov et al. | 375/345 |
| 7,570,936 B2 | * | 8/2009 | Vice | 455/326 |
| 7,577,418 B2 | * | 8/2009 | Chang et al. | 455/323 |
| 8,344,818 B1 | * | 1/2013 | Gamliel | 332/170 |
| 8,559,905 B2 | * | 10/2013 | Buer et al. | 455/310 |

* cited by examiner

*Primary Examiner* — Sonny Trinh
(74) *Attorney, Agent, or Firm* — Milstein Zhang & Wu LLC; Joseph B. Milstein

(57) ABSTRACT

A coplanar waveguide (CPW) based subharmonic mixer working at 670 GHz using GaAs Schottky diodes. One example of the mixer has a LO input, an RF input and an IF output. Another possible mixer has a LO input, and IF input and an RF output. Each input or output is connected to a coplanar waveguide with a matching network. A pair of anti-parallel diodes provides a signal at twice the LO frequency, which is then mixed with a second signal to provide signals having sum and difference frequencies. The output signal of interest is received after passing through a bandpass filter tuned to the frequency range of interest.

7 Claims, 13 Drawing Sheets

670 GHZ SCHOTTKY DIODE BASED SUBHARMONIC MIXER WITH CPW CIRCUITS AND 70 GHZ IF

CROSS-REFERENCE TO RELATED APPLICATIONS

This application claims priority to and the benefit of U.S. provisional patent application Ser. No. 61/481,633 filed May 2, 2011, which application is incorporated herein by reference in its entirety.

STATEMENT REGARDING FEDERALLY FUNDED RESEARCH OR DEVELOPMENT

The invention described herein was made in the performance of work under a NASA contract, and is subject to the provisions of Public Law 96-517 (35 USC 202) in which the Contractor has elected to retain title.

FIELD OF THE INVENTION

The invention relates to mixer circuits in general and particularly to a mixer circuit that is built in gallium arsenide.

BACKGROUND OF THE INVENTION

Gallium arsenide based high frequency circuits are known in the art.

JPL has developed a proprietary planar GaAs Schottky diode process that results in very low parasitic anodes that have cutoff frequencies in the tens of terahertz. This technology enables robust implementation of monolithic mixer and frequency multiplier circuits well into the terahertz frequency range. Using optical and e-beam lithography and conventional epitaxial layer design with innovative usage of GaAs membranes and metal beamleads JPL is able to design high performance terahertz circuits with high fidelity. This has lead to several instruments for space and earth-based platforms.

However, all these mixers use metal waveguide structures for housing. Metal machined structures for RF and LO coupling hampers these mixers to be integrated in multipixel heterodyne array receivers for spectroscopic and imaging applications.

There is a need for mixer circuits that are easier to fabricate and that can be integrated with other circuit elements.

SUMMARY OF THE INVENTION

According to one aspect, the invention features a mixer circuit. The mixer circuit comprises a LO input configured to receive an input LO signal having a frequency $f_{LO}$, the LO input signal provided by an first coplanar waveguide; a LO matching network configured to match the input coplanar waveguide to an antiparallel diode pair, the antiparallel diode pair configured to provide a signal at a frequency $2f_{LO}$; an RF input configured to receive an RF input signal having a frequency $f_{RF}$, the RF input signal provided by a second coplanar waveguide; an RF matching network configured to match the second input coplanar waveguide to the diode pair; the mixer configured to generate sum and difference signals, the sum signal having a frequency $f_{OUT+}=2f_{LO}+f_{RF}$ and the difference signal having a frequency $f_{OUT-}=|2f_{LO}-f_{RF}|$, where the difference frequency is always understood to be a frequency that is measured by the absolute value of the difference between the two input frequencies; an IF matching network configured to match the output circuitry to a coplanar waveguide and a filter configured to allow one of the sum signal and the difference signal to pass; and an IF output connected to a third coplanar waveguide.

According to another aspect, the invention relates to a mixer circuit. The mixer circuit comprises a LO input configured to receive an input LO signal having a frequency $f_{LO}$, the LO input signal provided by an first coplanar waveguide; a LO matching network configured to match the input coplanar waveguide to an antiparallel diode pair, the antiparallel diode pair configured to provide a signal at a frequency $2f_{LO}$; an IF input configured to receive an IF input signal having a frequency $f_{IF}$, the IF input signal provided by a second coplanar waveguide; an IF matching network configured to match the second input coplanar waveguide to the diode pair; the mixer configured to generate sum and difference signals, the sum signal having a frequency $f_{OUT+}=2f_{LO}+f_{IF}$ and the difference signal having a frequency $f_{OUT-}=|2f_{LO}-f_{IF}|$, where the difference frequency is always understood to be a frequency that is measured by the absolute value of the difference between the two input frequencies; an RF matching network configured to match the output circuitry to a coplanar waveguide and a filter configured to allow one of the sum signal and the difference signal to pass; and an RF output connected to a third coplanar waveguide.

According to another aspect, the invention relates to a method of fabricating a mixer circuit. The method comprises the steps of: on a surface of a semiconductor substrate: growing a first etch-stop layer; growing a layer of semi-insulating semiconductor; growing an second etch-stop layer on the layer of semi-insulating semiconductor; growing a contact layer on the etch stop layer; growing a Schottky layer on the contact layer; patterning and etching the Schottky layer to form diodes; metalizing the diodes; providing interconnects for the diodes, the diodes being connected in an antiparallel configuration; providing coplanar waveguides, input/output coupling probes, and IF output structures; fabricating on chip capacitors; providing vias to connect frontside and backside structures; and fabricating backside ground plane structures.

In one embodiment, the semiconductor is gallium arsenide.

In another embodiment, the Schottky layer is $3 \times 10^{17}$ to $5 \times 10^{17}$ cm$^{-3}$ doped n-type gallium arsenide.

In yet another embodiment, the contact layer is n$^+$ type gallium arsenide.

In still another embodiment, at least one of the first etch-stop layer and the second etch-stop layer comprises AlGaAs The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 9A shows the step of ohmic contact and mesa definition.

FIG. 9B shows the step of interconnect metal and e-beam defined Schottky deposition.

FIG. 9C shows the step of passivation and bridge metal 1 definition.

FIG. 9D shows the step of inverting the chip and mounting it on a carrier.

FIG. 9E shows the step of removal of the substrate and creating vias with a selective etch.

FIG. 9F shows the step of depositing back metal.

FIG. 9G is a cross sectional diagram showing the completed device.

DETAILED DESCRIPTION

Gallium arsenide (GaAs) based sub-harmonically pumped Schottky diode mixers offer a number of advantages for array implementation in a heterodyne receiver system. Since the radio frequency (RF) and local oscillator (LO) signals are far apart, system design becomes much simpler.

The recent developments of terahertz transistors on InP substrate provide an opportunity, for the first time, to have integrated amplifiers followed by Schottky diode mixers in a heterodyne receiver at these frequencies. Since the amplifiers are developed on a planar architecture to facilitate multi-pixel array implementation, it is quite important to find alternative architecture to waveguide based mixers.

We designed and fabricated a coplanar waveguide (CPW) based subharmonic mixer working at 670 GHz using GaAs Schottky diodes. CPW topology of the mixers allows the seamless integration of mixers and amplifiers for use in multi-pixel heterodyne array receivers.

Transmission lines such as microstrips and striplines are very lossy at terahertz frequencies, and therefore have a detrimental effect on the performance of Schottky diode mixers and have higher conversion loss and noise temperature. The mixers were designed using CPW coupling structures which have lower loss and are more amenable to planar architecture and higher level of integration. CPW lines are used to couple in the RF and LO signal to a pair of anti-parallel diodes. The LO is injected from one end where a CPW impedance matching network is provided. A quarter-wavelength short circuited stub (at the LO frequency) which shorts the RF at the LO end of the circuit. On the RF end, there is a CPW impedance matching network and an open circuited quarter wavelength stub (at the LO frequency) which acts as a short at the LO frequency at the RF end of the circuit. The IF is taken out through a CPW filter from the RF-end of the diodes.

In an integrated receiver system, the CPW lines—both for the RF and LO—can directly connect to low noise amplifiers for the RF and frequency multiplier output for the LO.

Most of the reported results for subharmonic mixers at 670 GHz use low-loss waveguide coupling structures and metal housing. This is the first time a planar CPW topology has been used to design and develop a subharmonic mixer at these frequencies. This design architecture leads to seamless integration with planar CPW amplifiers and can be used for multi-pixel heterodyne arrays.

Theory of Operation

Figure 1:
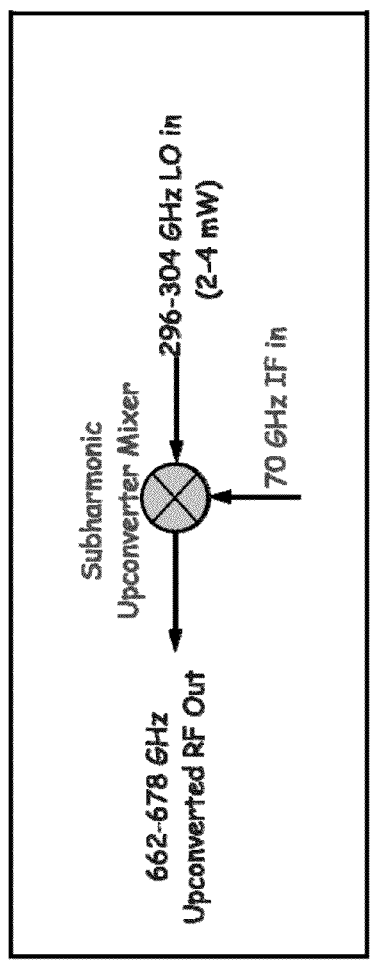
FIG. 1 is a schematic diagram of a 662-678 GHz upconverter mixer configuration according to principles of the invention.

FIG. 1 is a schematic diagram that shows how the device can be used as an upconverter. As illustrated in FIG. 1, the devices described here can be used in upconverters that have a local oscillator (LO) input signal at a frequency $f_{LO}$ and a 70 GHz IF input frequency, denoted $f_{IF}$. The upconverter provides an output signal at either of two possible frequencies, denoted as $f_{OUT+}$ and $f_{OUT-}$.

Figure 3:
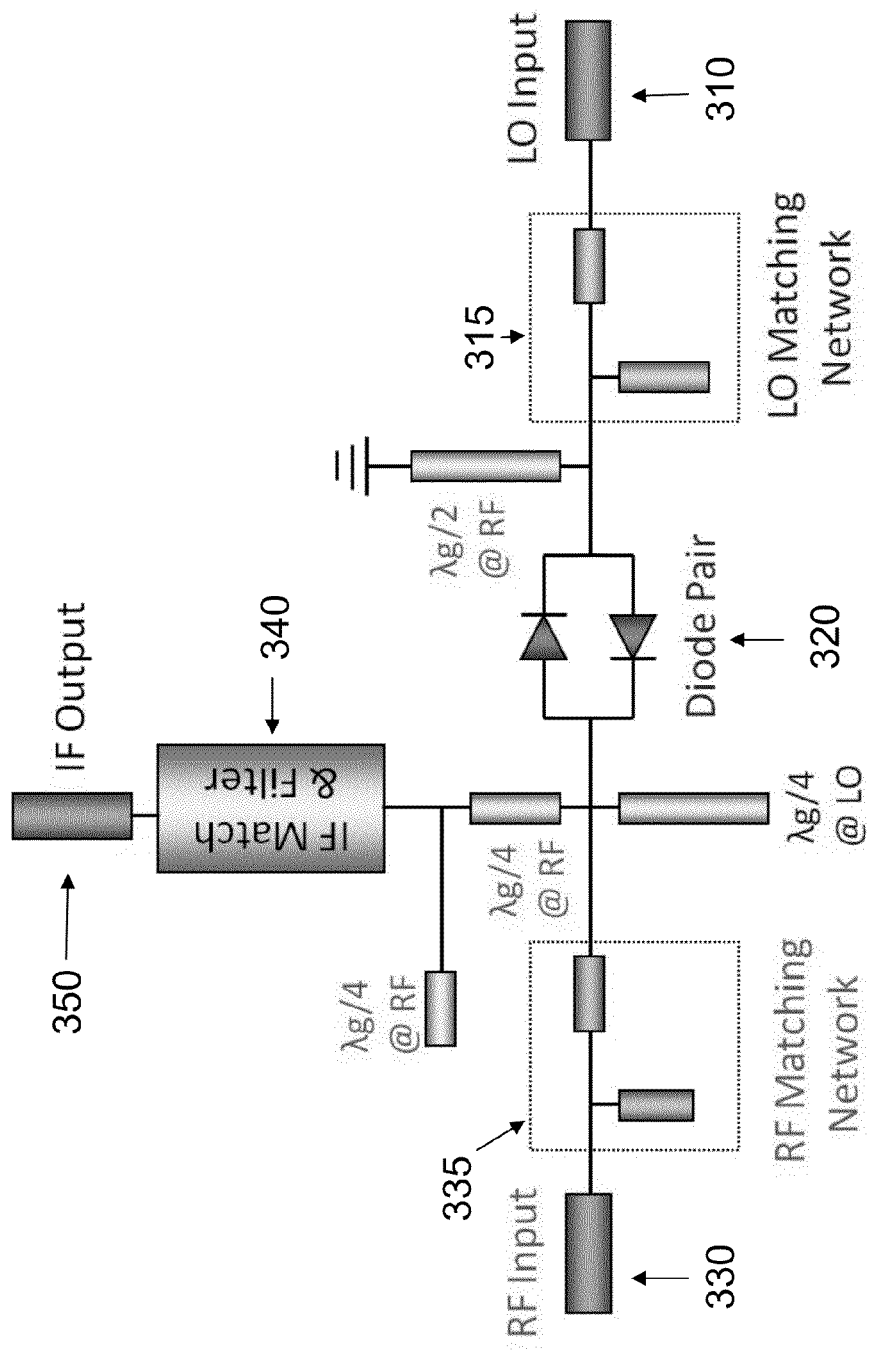
FIG. 3 is a schematic diagram of a downconverter mixer circuit showing additional detail.

The diodes 330 illustrated in FIG. 3 (also diodes 530 illustrated in FIG. 5B) receive the input LO signal at frequency $f_{LO}$, and provide an output signal at a frequency that is double the frequency $f_{LO}$, or $2f_{LO}$.

In FIG. 1, the frequency doubled LO signal is combined with the IF signal at frequency $f_{IF}$ to generate sum and difference frequencies given by $$f_{OUT+}=2f_{LO}+f_{IF}$$

$$f_{OUT-}=|2f_{LO}-f_{IF}|$$

where the difference frequency is always understood to be a frequency that is measured by the absolute value of the difference between the two input frequencies.

Examples of the two output frequencies $f_{OUT+}$ and $f_{OUT-}$ are illustrated in Table I.

TABLE I

| $f_{LO}$ | $2f_{LO}$ | $f_{IF}$ | $f_{OUT+}$ | $f_{OUT-}$ |
|---|---|---|---|---|
| 296 GHz | 592 GHZ | 70 GHz | 662 GHz | 522 GHz |
| 304 GHz | 608 GHz | 70 GHz | 678 GHz | 538 GHz |

As illustrated in FIG. 1, the output at the upconverted RF output can be obtained by passing the output signal through a bandpass filter having a pass frequency selected to fall within the range of 662 to 678 GHz if the summed signal is the one of interest, or through a bandpass filter having a pass frequency selected to fall within the range of 522 to 538 GHz if the difference signal is the one of interest.

Figure 2:
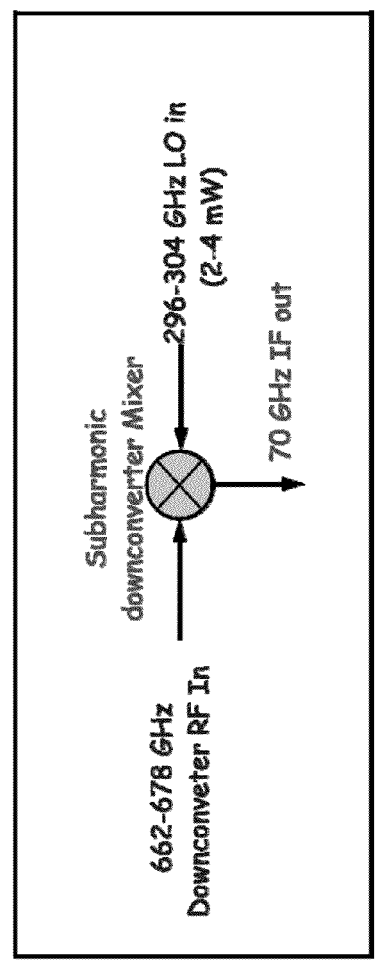
FIG. 2 is a schematic diagram of a 662-678 GHz downconverter mixer configuration according to principles of the invention.

FIG. 2 is a schematic diagram that shows how the device can be used as a downconverter. Again, a local oscillator provides an input signal at a frequency $f_{LO}$. The diodes 330 illustrated in FIG. 3 (also diodes 530 illustrated in FIG. 5B) receive the input LO signal at frequency $f_{LO}$, and provide an output signal at a frequency that is double the frequency $f_{LO}$, or $2f_{LO}$.

In FIG. 2, an RF signal having a frequency $f_{RF}$ in the range of 662 to 678 GHz is provided as an input signal at the RF input terminal (or input port). The signals are combined in the mixer to generate sum and difference signals given by $$f_{OUT+}=2f_{LO}+f_{RF}$$

$$f_{OUT-}=|2f_{LO}-f_{RF}|$$

where the difference frequency is always understood to be a frequency that is measured by the absolute value of the difference between the two input frequencies.

Examples of the two output frequencies $f_{OUT+}$ and $f_{OUT-}$ are illustrated in Table II.

TABLE II

| $f_{LO}$ | $2f_{LO}$ | $f_{RF}$ | $f_{OUT+}$ | $f_{OUT-}$ |
|---|---|---|---|---|
| 296 GHz | 592 GHZ | 662 GHz | 1254 GHz | 70 GHz |
| 304 GHz | 608 GHz | 662 GHz | 1270 GHz | 78 GHz |
| 296 GHz | 592 GHZ | 678 GHz | 1270 GHz | 86 GHz |
| 304 GHz | 608 GHz | 678 GHz | 1286 GHz | 70 GHz |

As illustrated in FIG. 2, the output at the RF output can be obtained by passing the output signal through a bandpass filter having a pass frequency selected to fall within the range of 1254 to 1286 GHz (1.254 to 1.286 THz) if the summed signal is the one of interest, or through a bandpass filter having a pass frequency selected to fall within the range of 70 to 78 GHz if the difference signal is the one of interest.

FIG. 3 is a schematic diagram of a downconverter mixer circuit showing additional detail. LO input 310 is configured to receive an input LO signal provided by a coplanar waveguide. LO matching network 315 is provided to match the input coplanar waveguide to the diode pair 320. RF input 330 is configured to receive an RF input signal provided by a coplanar waveguide. RF matching network 335 is provided to match the input coplanar waveguide to the diode pair 320. In the output side of the diode pair 320 there is an IF matching network and filter 340 that is configured to allow a signal in the frequency range of interest to pass and to match the output circuitry to a coplanar waveguide. IF output 350 is provided as the terminal where the output IF signal appears.

For circuits having an LO input, an IF input and an RF output, matching networks would be provided at the input terminals and a matching an filtering network would be provided at the output terminal, the filter having a pass band in the frequency range of the output signal of interest. In principle, there is no reason why two output terminals could not be provided, one with a filter having a pass band at the sum frequency of interest and one with a filter having a pass band at the difference frequency of interest.

Figure 4:
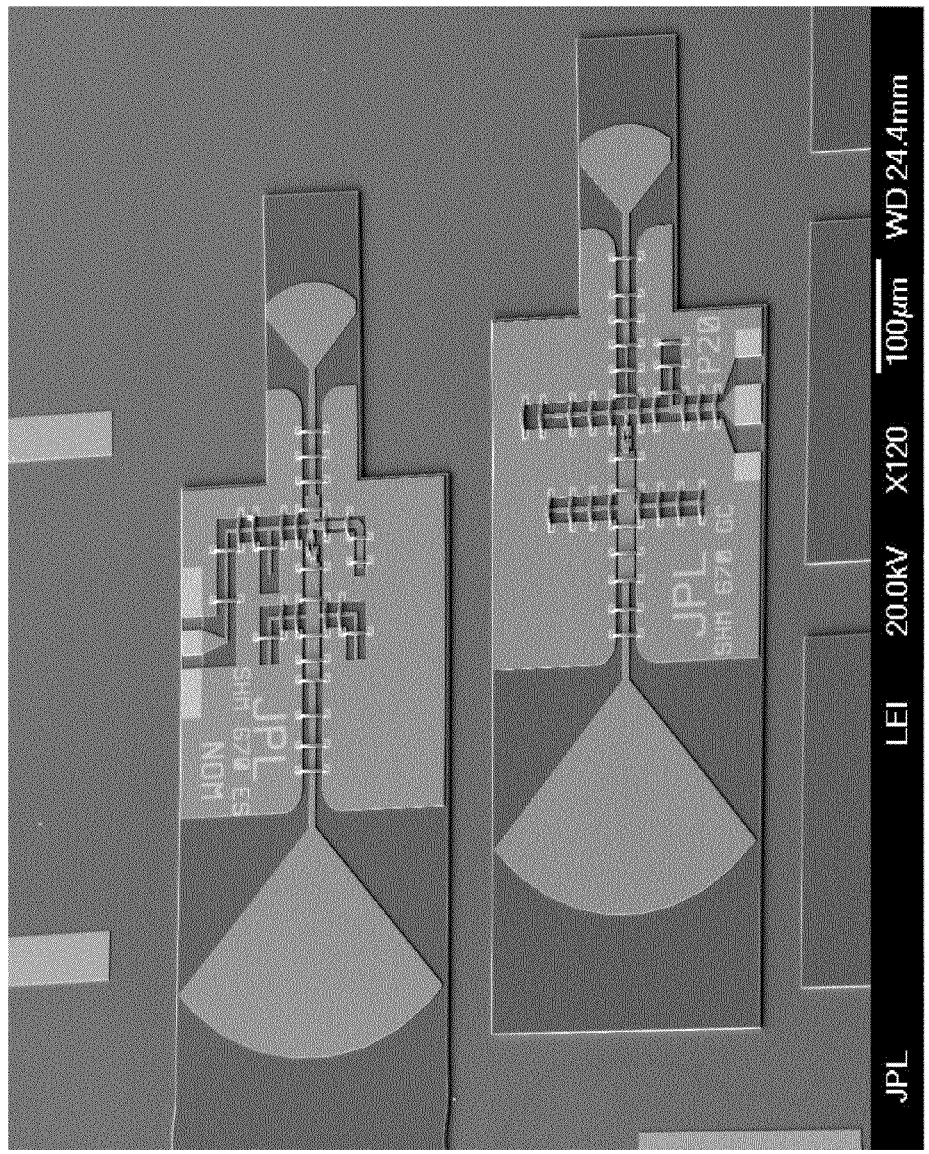
FIG. 4 is an image of a plurality of the fabricated devices next to each other.

FIG. 4 is an image of a plurality of the fabricated devices next to each other. CPW strip line inputs and output are shown as well.

Figure 5A:
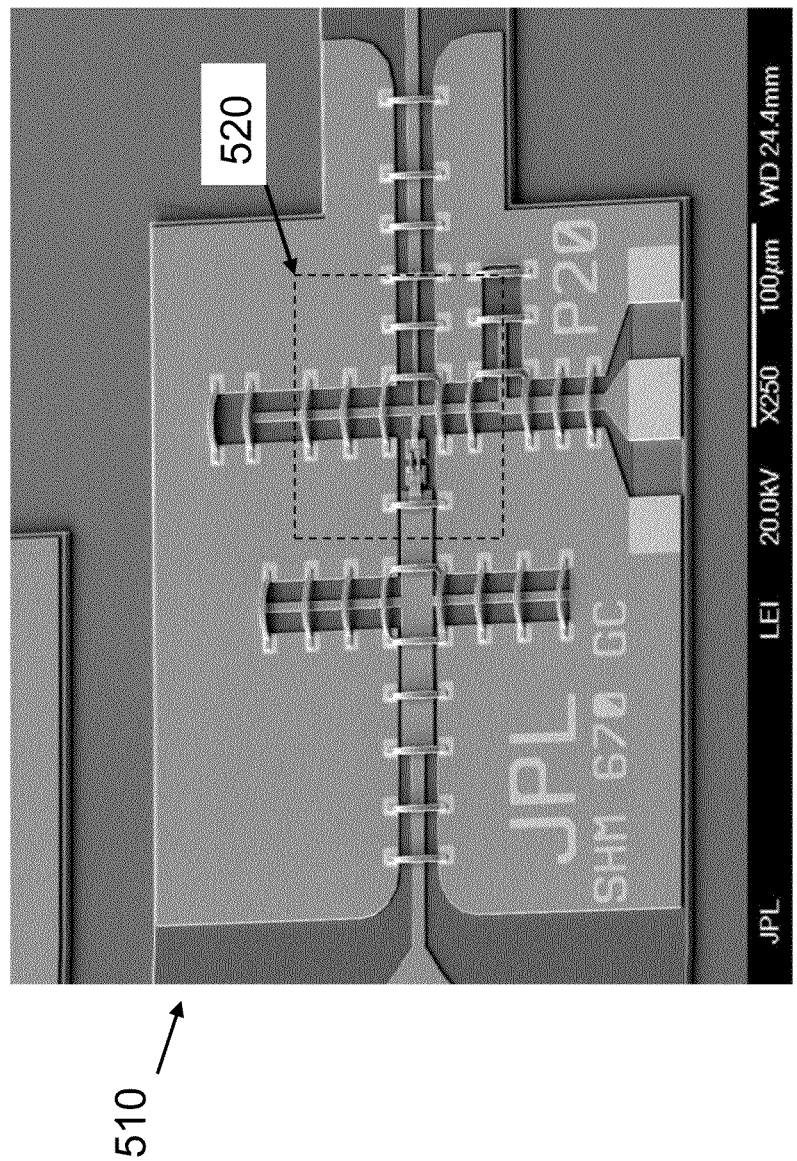
FIG. 5A shows an image of a single device.

FIG. 5A shows an image of a single device, in which region 520 includes the diode pair.

Figure 5B:
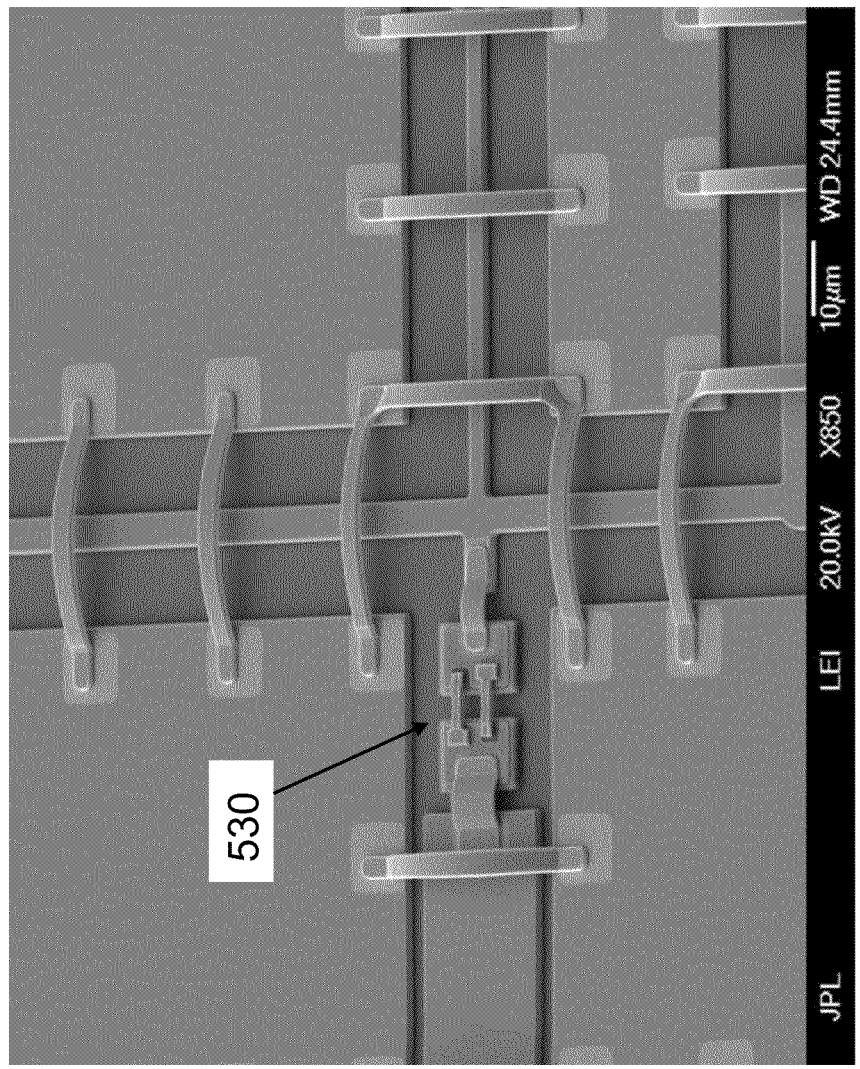
FIG. 5B is a close-up image of the anode area of the device in FIG. 5A.

FIG. 5B is a close-up image of the anode area 520 of the device in FIG. 5A, in which 530 denotes the diode pair.

Figure 6:
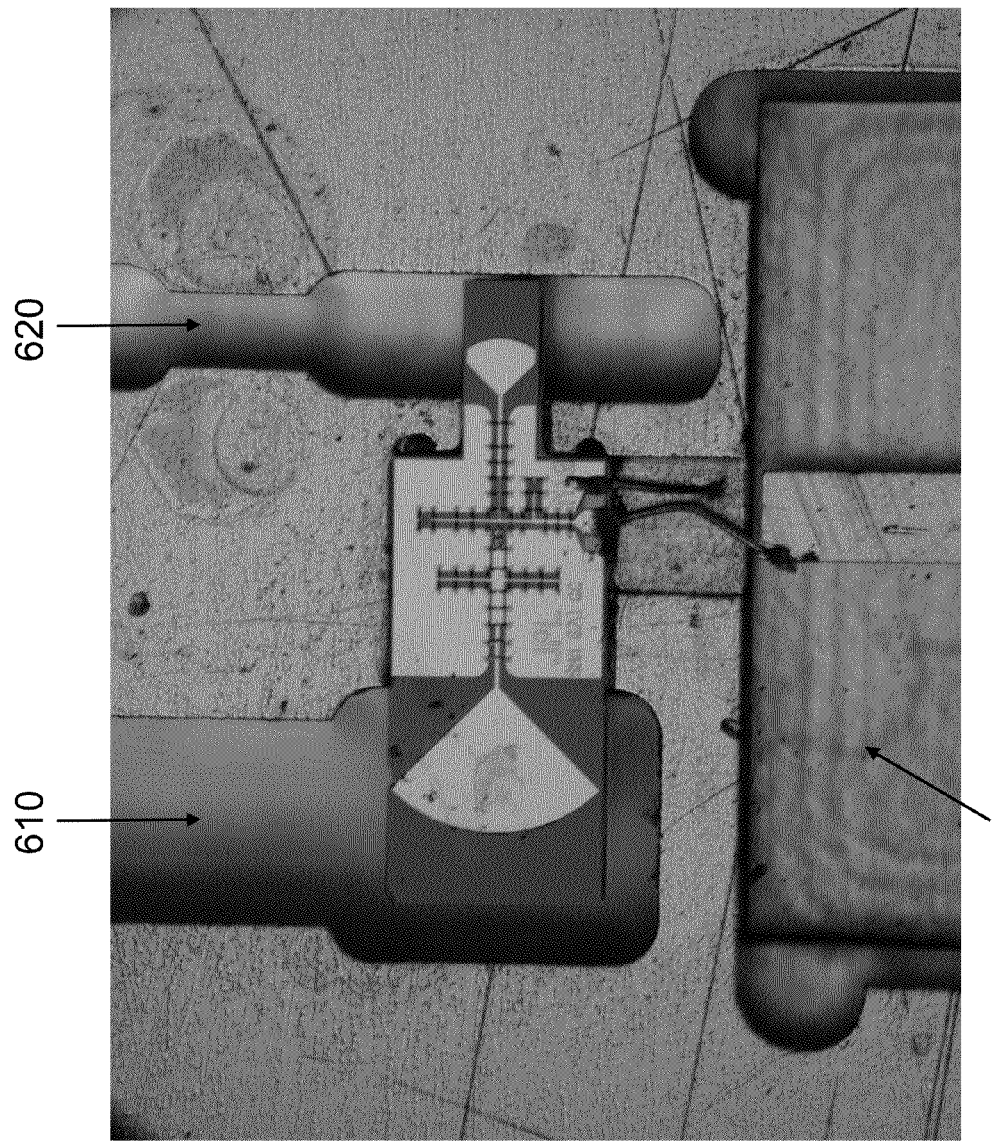
FIG. 6 is an image of an assembled device in a waveguide for testing.

FIG. 6 is an image of an assembled device in a waveguide for testing. The LO input 610, the RF input 620 and the IF output 630 are shown.

Figure 7:
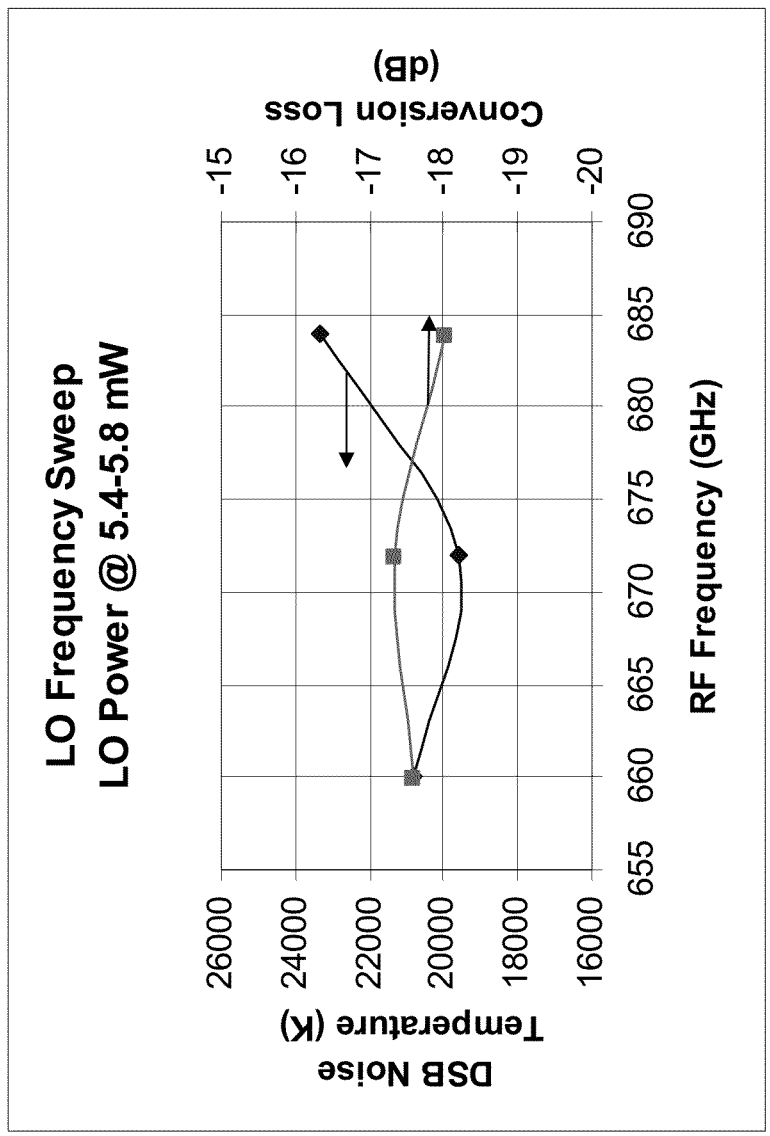
FIG. 7 is a graph of DSB noise temperature and of conversion loss vs. RF frequency.

FIG. 7 is a graph of DSB noise temperature and of conversion loss vs. RF frequency. Arrows indicate which curve is to be read with which vertical axis.

Figure 8:
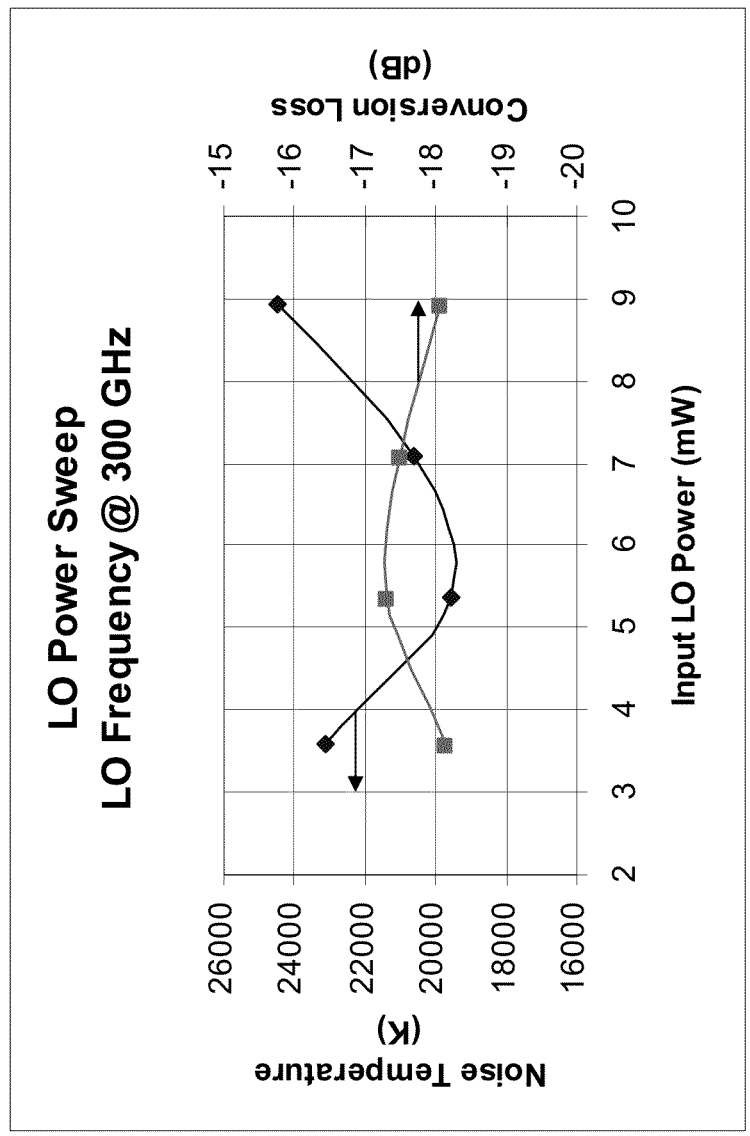
FIG. 8 is a graph of noise temperature and of conversion loss vs. input LO power.

FIG. 8 is a graph of noise temperature and of conversion loss vs. input LO power. Arrows indicate which curve is to be read with which vertical axis.

Device Fabrication

Fabrication of discrete diode devices on GaAs substrate and then mounting the diodes on a quartz substrate has worked well at lower frequencies. However, at frequencies beyond a couple of hundred of gigahertz, an integrated approach is required where the diodes and associated matching circuits are fabricated on the same substrate with integrated coupling probes. This gives the designers more options for controlling the device parasitics and for optimizing tuning circuits. For frequencies below 1 THz, integrated device fabrication with optical lithography and conventional epitaxial layer designs can be used. For devices operating beyond 1 THz, electron-beam lithography with complex epitaxial layers for GaAs membrane definition are generally used. We now describe a device fabrication technology developed at JPL for fabricating Schottky diode based MMIC multiplier circuits working at terahertz frequencies. The technology can also be used for fabricating circuits that embody the principles of the invention.

Figure 9A:
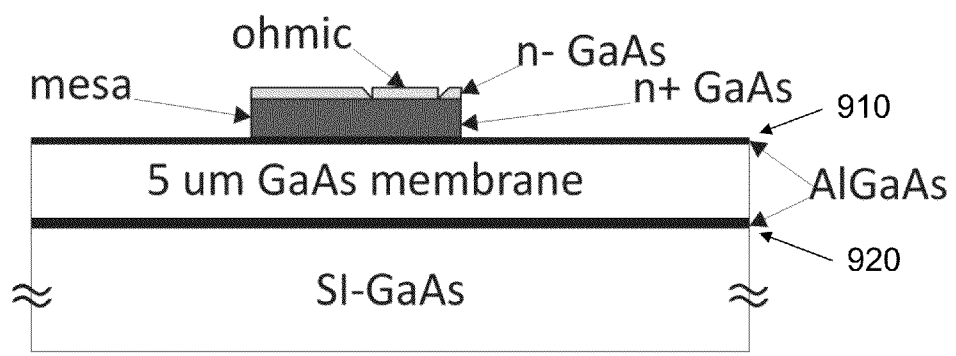
FIG. 9A through FIG. 9G illustrate in cross-section (elevation) the Schottky device fabrication process steps developed at the Jet Propulsion Laboratory.
Figure 9B:
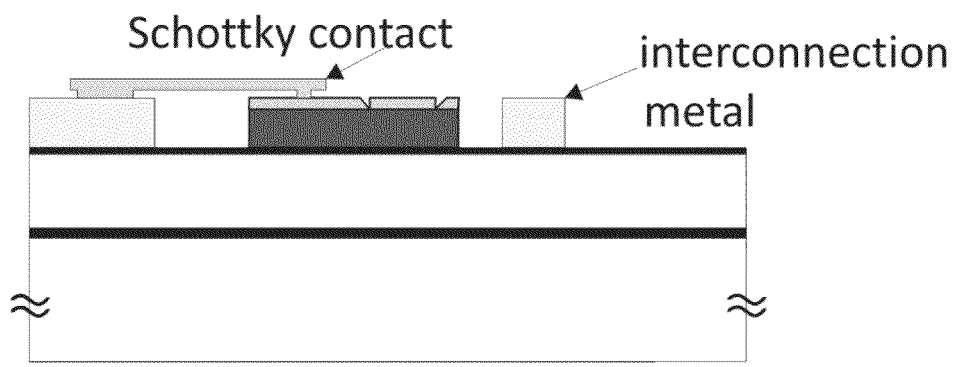
Figure 9C:
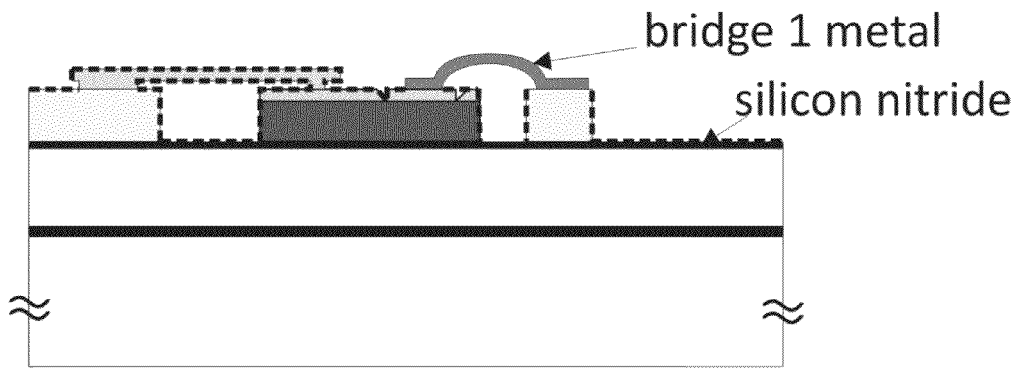
Figure 9D:
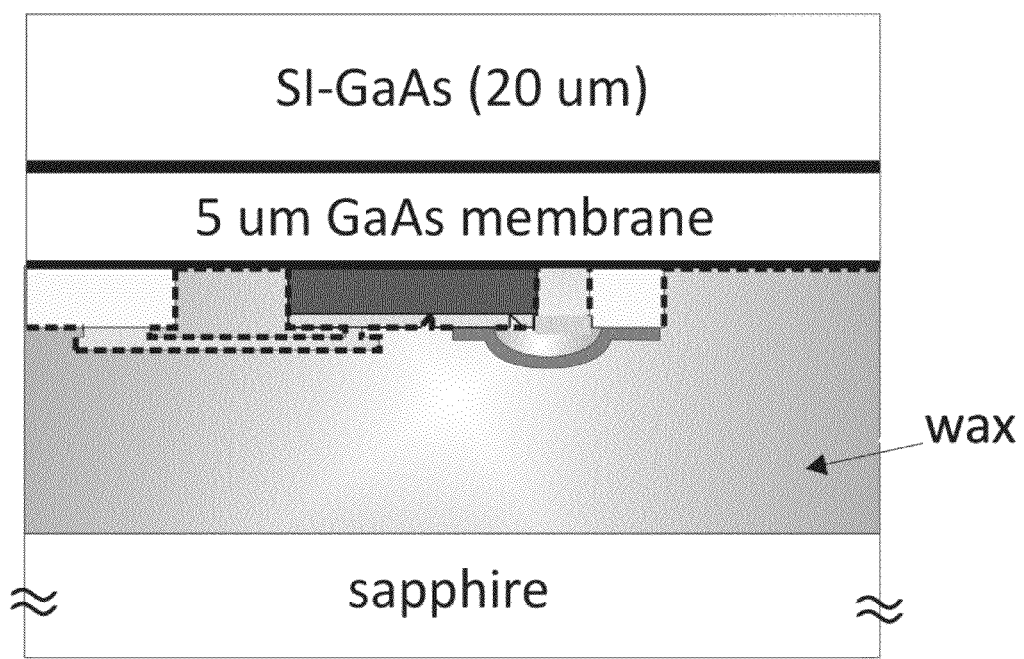
Figure 9E:
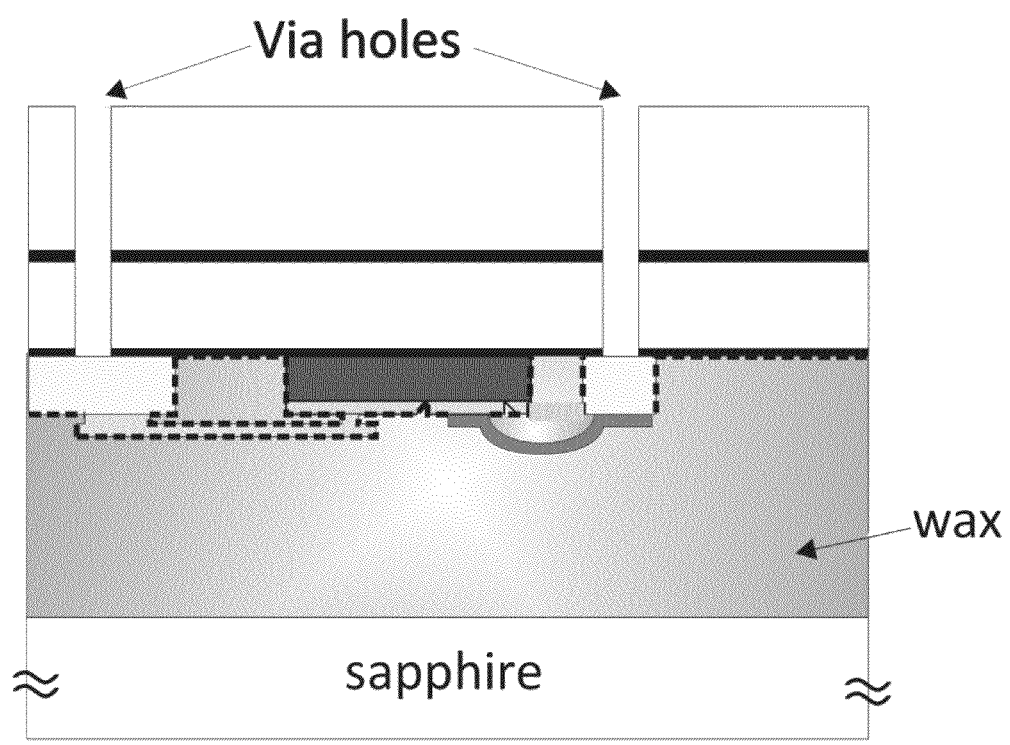
Figure 9F:
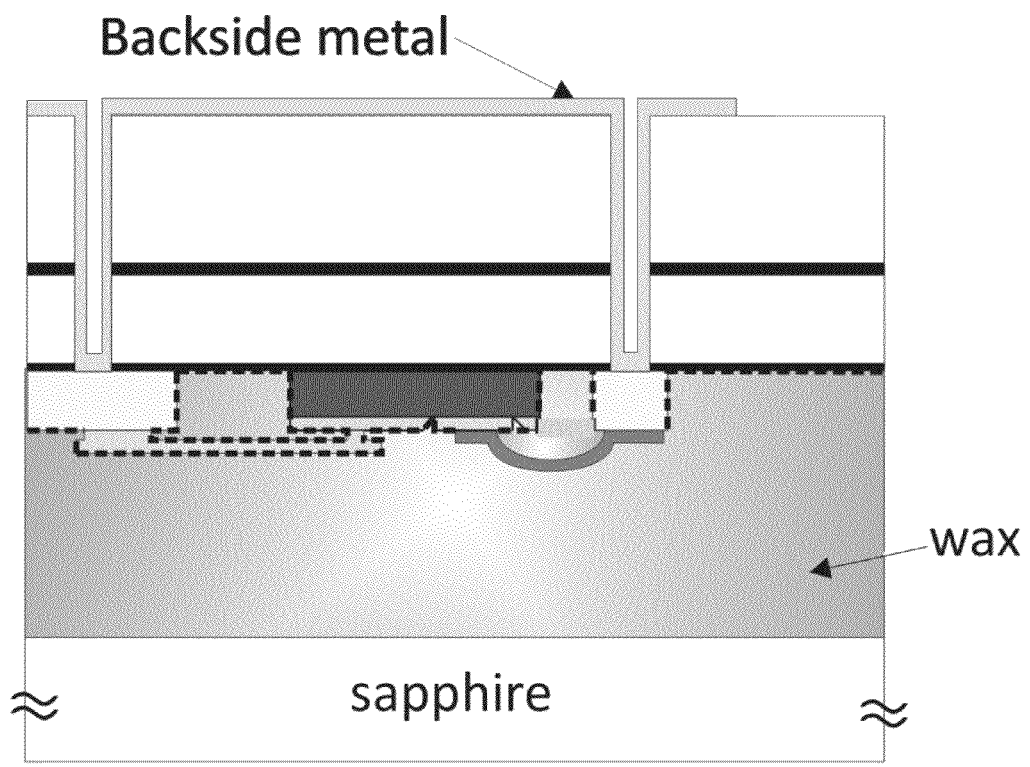
Figure 9G:
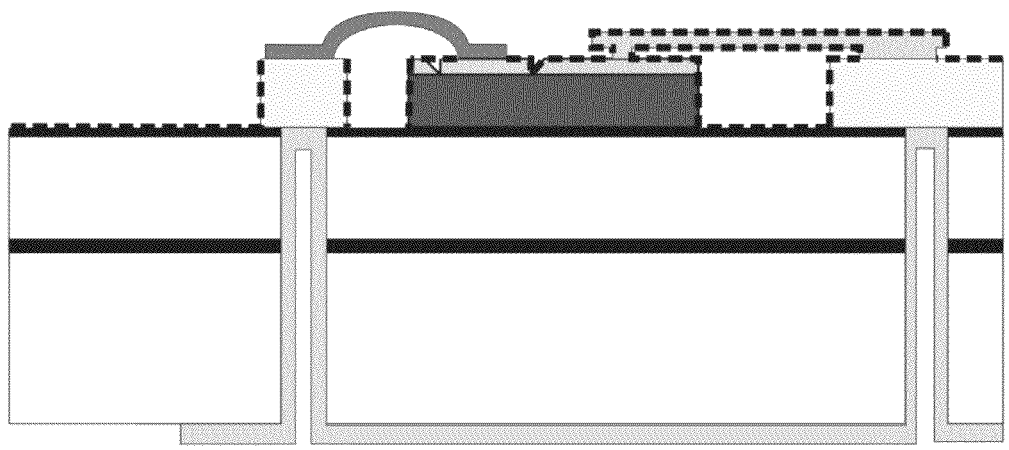

FIG. 9A through FIG. 9G show the different steps used for the JPL device fabrication process on a thin GaAs membrane. The starting material for this process is semi-insulating GaAs with epitaxial layers grown by molecular-beam epitaxy (MBE) or metal organic chemical vapor deposition (MOCVD). The diode structure comprises an approximately 200-nm-thick, $3 \times 10^{17}$ to $5 \times 10^{17}$ cm$^{-3}$ doped n-type Schottky layer which is fabricated into the anode of the diode on top of a heavily doped (typically $5 \times 10^{18}$ cm$^{-3}$) approximately 1.5 µm thick n$^+$ ohmic contact layer grown on a 50-nm aluminum-gallium-arsenide (AlGaAs) etch-stop layer 910. A mesa comprises the Schottky layer and the ohmic contact layer. There is an additional epitaxial layer comprising a very thin layer (typically 2-5 µm thick) of undoped GaAs membrane layer supporting the diode layers and a second Al—GaAs etch-stop layer 920, as shown in FIG. 9A. In the first step, the heavily doped ohmic contact layer is exposed by wet etching (in other words, chemical etching) and a metallization process is performed in order to form an ohmic contact which is the cathode of the diodes. The device mesas are defined by etching both Schottky and ohmic contact layers using a selective dry etch (in other words, plasma etching) using an Inductive Plasma Coupled (ICP) etcher, which stops at the AlGaAs etch-stop layer 910. The metal layer deposited in order to form the anode in the Schottky diodes and the interconnection metals deposited in order to form the coplanar waveguides (CPWs) are deposited and patterned using a lift-off process in two separate steps. As shown in FIG. 9B, the interconnect metal is deposited to a thickness substantially equal to the height of the mesas in order to improve the uniformity in the planarization process during the anode forming process. Following Schottky metallization and liftoff, silicon nitride (Si$_3$N$_4$) is deposited, as illustrated by the broken lines in FIG. 9C. Silicon nitride acts as the dielectric for the integrated bias capacitor in addition to passivating the diodes. The top contacts to the capacitors and the connection to the on-mesa ohmic metal area is achieved using an air-bridge metal step. After defining the membrane areas of the circuit from the top side of the wafer, reactive ion etching (RIE) is used to remove the silicon nitride layer, followed by another RIE of the thin 2-5 µm GaAs membrane layer, down to the second AlGaAs etch-stop layer 920. In the final front-side metallization step, the second airbridge is patterned. The wafers are then waxmounted topside-down onto a carrier wafer, such as a sapphire wafer as illustrated in FIG. 9D. The GaAs substrates are thinned down to 25 um using a lapping/polishing machine as shown in FIG. 9D. The photoresist used as an etch mask is patterned. The 25 um thick GaAs membranes are etched by Reactive Ion Etching (RIE) in order to form via holes as shown in FIG. 9E. Then, titanium and gold metals are sputtered on the backside of the GaAs wafer in order to connect the top metal and bottom grounding metals. The Ti layer is a contact and adhesion layer and the gold provides high conductivity. Then, gold is electroplated to increase the thickness of the gold metal to obtain the desired high conductivity value. After that, the titanium layer and the gold metal are patterned using photolithography and a wet etching processes as shown in FIG. 9F. Then the sapphire wafers are diced with a dicing machine. Each diced reticle is bonded to another carrier wafer and then both backside photolithography and 25 µm thick membrane etching is performed using RIE in order to separate the individual chips from each other. Finally, the circuits are removed from the carrier wafer by dissolving the mounting wax, yielding the circuit as shown in FIG. 9G.

The microfabrication procedures for making devices as shown in FIG. 4 through FIG. 6 are as follows.

1. The ohmic metallization for the cathodes of the Schottky diodes is performed.
2. Another metallization is performed in order to make coplanar waveguide, input/output coupling probes, and the IF output structures.
3. The Schottky metallization has been done for forming the anodes in the Schottky diodes.
4. On-chip capacitors have been fabricated using silicon nitride film as a dielectric.
5. The first air bridges have been fabricated to provide DC metal connection between the ohmic contacts and the signal metal in the coplanar waveguide,
6. The membrane has been defined in the frontside of the membrane.

After all the processing steps mentioned above on the frontside of the wafer were completed, the GaAs wafers were shipped to a contractor for the backside processing that was performed by the contractor according to our directions as follows (because the necessary equipment was not available at JPL).

7. The frontside-processed wafers were mounted to carrier wafers (for example, sapphire wafers).
8. The mounted GaAs wafers were thinned down to a 25 μm thick GaAs membrane using a lapping/polishing machine.
9. Via-holes were formed using a plasma etching machine in order to connect the ground metal on the frontside to that on the backside.
10. Metal was sputtered and electroplated on the backside of the membrane in order to form the ground metal on the backside.
11. The backside metal was patterned using both photolithography and metal etching processes.

After the backside processes were completed, the wafers were returned to JPL for the final processing steps.

12. The wafers were mounted on another carrier wafer.
13. The backside photolithography was performed to provide membrane definition on the backside of the wafer.
14. The thin 25 μm GaAs membrane was patterned using a plasma etching process.
15. The individual chips were released from the carrier wafers using solvent solutions.

Wafer testing was then performed.

DEFINITIONS

Unless otherwise explicitly recited herein, any reference to an electronic signal or an electromagnetic signal (or their equivalents) is to be understood as referring to a non-volatile electronic signal or a non-volatile electromagnetic signal.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A mixer circuit, comprising:
    a LO input configured to receive an input LO signal having a frequency $f_{LO}$, said LO input signal provided by an first coplanar waveguide;
    a LO matching network configured to match said input coplanar waveguide to an antiparallel diode pair, said antiparallel diode pair configured to provide a signal at a frequency $2f_{LO}$;
    an RF input configured to receive an RF input signal having a frequency $f_{RF}$, said RF input signal provided by a second coplanar waveguide;
    an RF matching network configured to match said second input coplanar waveguide to said diode pair;
    said mixer configured to generate sum and difference signals, said sum signal having a frequency $f_{OUT+}=2f_{LO}+f_{RF}$ and said difference signal having a frequency $f_{OUT-}=|2f_{LO}-f_{RF}|$, where the difference frequency is always understood to be a frequency that is measured by the absolute value of the difference between the two input frequencies;
    an IF matching network configured to match the output circuitry to a coplanar waveguide and a filter configured to allow one of said sum signal and said difference signal to pass; and
    an IF output connected to a third coplanar waveguide.

2. A mixer circuit, comprising:
    a LO input configured to receive an input LO signal having a frequency $f_{LO}$, said LO input signal provided by an first coplanar waveguide;
    a LO matching network configured to match said input coplanar waveguide to an antiparallel diode pair, said antiparallel diode pair configured to provide a signal at a frequency $2f_{LO}$;
    an IF input configured to receive an IF input signal having a frequency $f_{IF}$, said IF input signal provided by a second coplanar waveguide;
    an IF matching network configured to match said second input coplanar waveguide to said diode pair;
    said mixer configured to generate sum and difference signals, said sum signal having a frequency $f_{OUT+}=2f_{LO}+f_{IF}$ and said difference signal having a frequency $f_{OUT-}=|2f_{LO}-f_{IF}|$, where the difference frequency is always understood to be a frequency that is measured by the absolute value of the difference between the two input frequencies;
    an RF matching network configured to match the output circuitry to a coplanar waveguide and a filter configured to allow one of said sum signal and said difference signal to pass; and
    an RF output connected to a third coplanar waveguide.

3. A method of fabricating a mixer circuit, comprising the steps of:
    on a surface of a semiconductor substrate:
        growing a first etch-stop layer;
        growing a layer of semi-insulating semiconductor;

growing an second etch-stop layer on said layer of semi-insulating semiconductor;
growing a contact layer on said etch stop layer;
growing a Schottky layer on said contact layer;
patterning and etching said Schottky layer to form diodes;
metalizing said diodes;
providing interconnects for said diodes, said diodes being connected in an antiparallel configuration;
providing coplanar waveguides, input/output coupling probes, and IF output structures;
fabricating on chip capacitors;
providing vias to connect frontside and backside structures; and
fabricating backside ground plane structures.

4. The method of fabricating a mixer circuit of claim 3, wherein said semiconductor is gallium arsenide.

5. The method of fabricating a mixer circuit of claim 3, wherein said Schottky layer is $3 \times 10^{17}$ to $5 \times 10^{17}$ cm$^{-3}$ doped n-type gallium arsenide.

6. The method of fabricating a mixer circuit of claim 3, wherein said contact layer is n$^+$ type gallium arsenide.

7. The method of fabricating a mixer circuit of claim 3, wherein at least one of said first etch-stop layer and said second etch-stop layer comprises AlGaAs.

* * * * *